US009999138B2

(12) United States Patent
Borel

(10) Patent No.: US 9,999,138 B2
(45) Date of Patent: Jun. 12, 2018

(54) MAKING INTERCONNECTIONS BY CURVING CONDUCTING ELEMENTS UNDER A MICROELECTRONIC DEVICE SUCH AS A CHIP

(71) Applicant: Commissariat a L'Energie Atomique et aux Energies Alternatives, Paris (FR)

(72) Inventor: Stephan Borel, Crolles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days. days.

(21) Appl. No.: 15/351,891

(22) Filed: Nov. 15, 2016

(65) Prior Publication Data
US 2017/0150615 A1 May 25, 2017

(30) Foreign Application Priority Data
Nov. 23, 2015 (FR) ...................................... 15 61241

(51) Int. Cl.
H05K 3/40 (2006.01)
H01L 21/78 (2006.01)
(Continued)

(52) U.S. Cl.
CPC ........... *H05K 3/4092* (2013.01); *H01L 21/78* (2013.01); *H01L 23/49811* (2013.01); *H05K 3/326* (2013.01)

(58) Field of Classification Search
CPC ...... H05K 3/4092; H05K 3/326; H01L 21/78; H01L 23/49811
See application file for complete search history.

(56) References Cited

U.S. PATENT DOCUMENTS 5,501,893 A 3/1996 Laermer et al.
5,526,230 A 6/1996 Val
(Continued)

FOREIGN PATENT DOCUMENTS

WO WO 2008/155231 A1 12/2008
WO WO 2011/126726 A1 10/2011

OTHER PUBLICATIONS

French Preliminary Search Report issued Jul. 8, 2016 in French Application 15 61241 filed on Nov. 23, 2015 (with English Translation of Categories of Cited Documents).
(Continued)

*Primary Examiner* — Mamadou Diallo
(74) *Attorney, Agent, or Firm* — Oblon, McClelland, Maier & Neustadt, L.L.P.

(57) ABSTRACT

A method of making connection elements for a microelectronic device is provided, including foil ling a conducting layer on a support on which there is at least one conducting pad located on a front face of the support opposite a back face thereof, the conducting layer including a first conducting portion in contact with at least one conducting pad, the first conducting portion extending on the front face and being connected to at least one second conducting portion extending in contact with at least one given wall of the support being located between the front and back faces and forming a non-zero angle with the front face; thinning the support at the back face to release one conducting end of the second conducting portion as a free conducting end projecting from the back face; and after the thinning, bending the free conducting end projecting from the back face.

15 Claims, 8 Drawing Sheets

(51) Int. Cl.
  *H05K 3/32* (2006.01)
  *H01L 23/498* (2006.01)

(56) References Cited

U.S. PATENT DOCUMENTS

| | | |
|---|---|---|
| 5,825,084 A | 10/1998 | Lau et al. |
| 7,446,384 B2 | 11/2008 | Paik et al. |
| 2004/0157410 A1 | 8/2004 | Yamaguchi |
| 2008/0274603 A1* | 11/2008 | Do .................... H01L 21/76898 438/462 |
| 2009/0051046 A1 | 2/2009 | Yamazaki et al. |
| 2010/0072588 A1* | 3/2010 | Yang ................ H01L 23/49816 257/676 |
| 2010/0301474 A1* | 12/2010 | Yang ................... H01L 21/6835 257/737 |
| 2010/0317153 A1 | 12/2010 | Do et al. |
| 2011/0097909 A1 | 4/2011 | Bolis et al. |

OTHER PUBLICATIONS

Xiaodong Wang, et al., "High aspect ratio Bosch etching of sub-0.25 μm trenches for hyperintegration applications", Journal of Vacuum Science & Technology B, 2007, 7 pgs.

\* cited by examiner

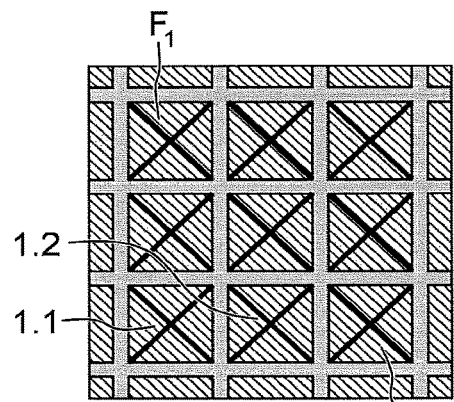 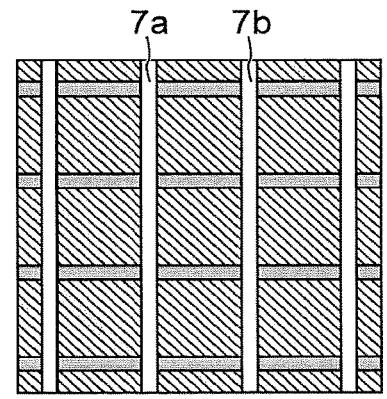
FIG.3A  FIG.3B
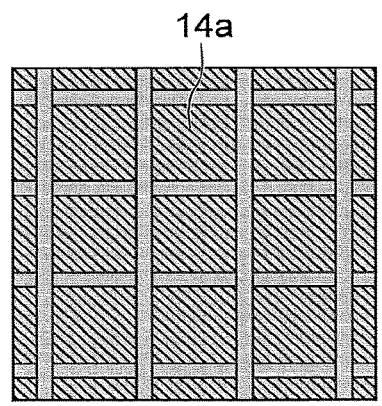 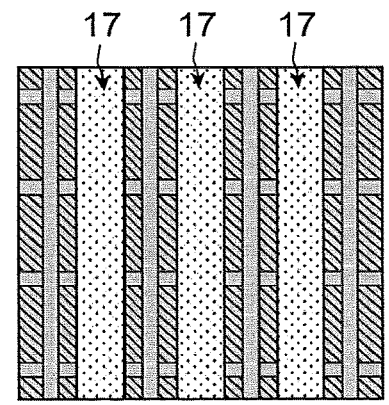
FIG.3C  FIG.3D
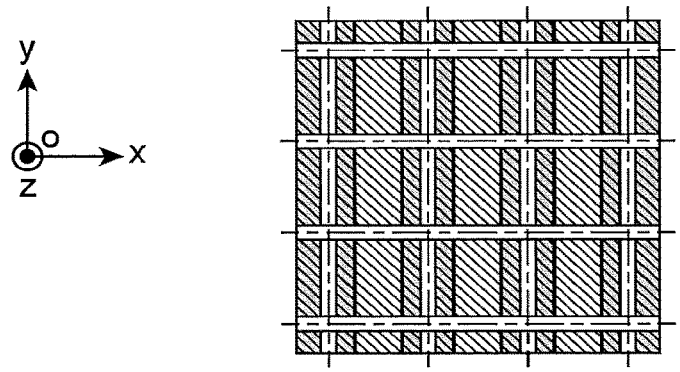
FIG.3E

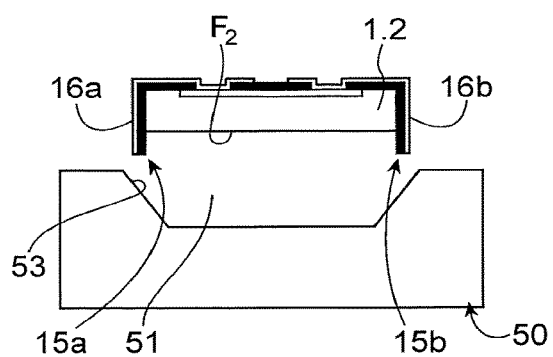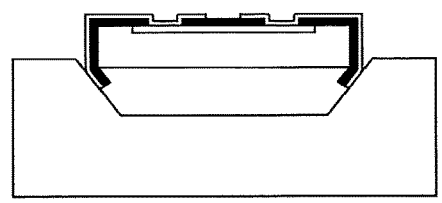
FIG.5A  FIG.5B
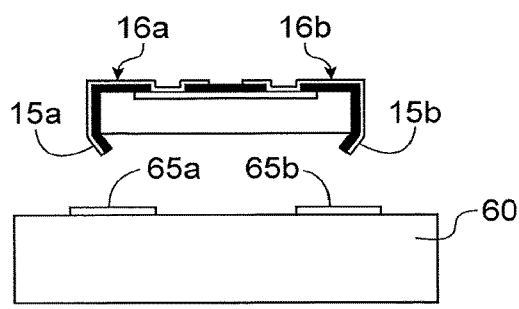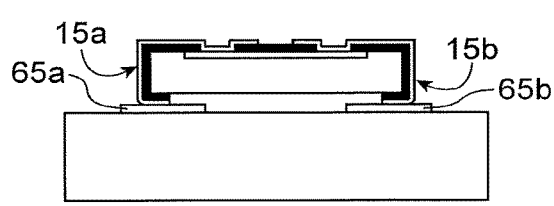
FIG.6A  FIG.6B

MAKING INTERCONNECTIONS BY CURVING CONDUCTING ELEMENTS UNDER A MICROELECTRONIC DEVICE SUCH AS A CHIP

TECHNICAL DOMAIN AND PRIOR ART

There are several ways in which a microelectronic device such as a chip can be connected to another support provided with conducting pads, including:

"wire bonding" type connection techniques in which a chip and a support are bonded to each other and then connected through conducting wires;

"flip-chip" type connection techniques in which the chip is turned over to bring conducting pads on its front face into contact with the support.

Another method of connecting pads 33 located on the front face of a chip 34 to pads 31 located on the front face of another support 32 without needing to turn the other support over, consists of using interconnection elements 35 passing through the thickness of the chip. Fabrication of these interconnection elements commonly called TSV (Through Silicon Vias) includes the formation of holes passing through the entire thickness of the chip, and then insulation of the lateral flanks of the holes, and then metallisation of the holes.

One disadvantage of such a method lies in the fact that it is generally necessary to make other conducting pads 36 on the back of the chip 34 at one end of the interconnection elements, so that the chip 34 can be connected to the other support 32. To achieve this, extra steps are carried out to deposit a conducting layer on the back face of the chip 34 and patterns are formed in this layer.

FIG. 1 shows a subsequent assembly between the conducting pads 36 that had to be made on the back face of the chip 34 and the pads 31 on the other support 32.

The question arises of finding a new method of making a new method of making interconnections without the above-mentioned disadvantages.

PRESENTATION OF THE INVENTION

According to one embodiment, this invention applies to a method of making one or more connection elements projecting from the back face of a support, the connection elements being connected to one or several conducting pads located on the front face of the support, the method including steps for:

a) forming a conducting layer on the support, the conducting layer being arranged such that it comprises a first conducting portion in contact with at least one conducting pad located on the front face, the first conducting portion extending on the front face and being connected to at least one second conducting portion extending in contact with at least one given wall of the support, the given wall being located between the front face and the back face and making a non-zero angle with the front face of the support, b) thinning the support at its back face so as to release one end of the second conducting portion from the support.

This free conducting end projects beyond the back face of the support and can make a connection between a conducting pad located on the front face and another pad or device located on the back face.

The conducting pads may be placed on the corresponding active parts of the chips.

According to one possible embodiment, the method comprises a step to make one or more trenches through the front face of the support before the step a), the trenches having a bottom within the thickness of the support.

The trenches are then covered by the conducting layer in step a).

Such a method can be used to make connection elements using a smaller useful area of the support than the TSV interconnection elements so that these elements can be moved out of a useful zone.

The trench(es) can be used to form a delimitation between the integrated circuits or electronic chips or electronic components located in the support.

Unlike common wire bonding techniques, the method can be used to make connection elements collectively over the scale of a support or a wafer on which there are several integrated circuits or several electronic chips or several electronic components.

These connection elements may be made to circumvent a chip around its lateral edges and project beyond the back face or underneath this chip so that they can then be curved along the back face or underneath this chip.

The conducting layer can then be deposited so as to cover the bottom and the side walls of a trench. This makes it possible to make two conducting portions simultaneously for two distinct structures or chips delimited by this trench.

In one particular embodiment, a trench can be made that is open at the front face of the support provided with a lateral wall making an angle of less than 90° with the front face. It is then sufficient to form the free conducting end on an inclined lateral well, making it easier to bend it and/or assemble it with another structure or another chip later.

According to one possible embodiment in which the conducting layer is formed in step a) such that it comprises a third conducting portion connected to the second conducting portion and a fourth conducting portion coating the other lateral wall of the trench, the third conducting portion coating the bottom of the trench and connecting the second conducting portion and the fourth conducting portion, the thinning step b) can be done so as to reach the bottom of the trench and eliminate the third conducting portion so as to release a conducting end of the second and fourth portions.

In this case, the thinning step provides a means of separating the third conducting portion from the fourth conducting portion, these portions possibly being intended to form distinct connection elements that could form part of different chips or circuits or components.

The trenches could be coated with an insulating layer capable of electrically isolating the support from the conducting layer, before step a) and the deposition of the conducting layer. In particular, the insulating layer may be formed on an internal wall of a trench that will form a lateral edge of a chip.

According to one possible embodiment of the method in which the support comprises at least one trench opening up on its front face, the method may also include the production of conducting patterns in the conducting layer, between step a) and step b).

A step to remove the conducting layer locally can also be included so as to define discontiguous conducting elements along the lateral wall of the trench. This local removal may for example be done by making a hole or a chase in the lateral wall or for example making a laser ablation of a zone in the conducting layer located on the lateral wall.

According to one possible embodiment, the method may also include a step to transfer a mechanical backing means on the front face of the support, between step a) and step b). This backing means keeps the different support regions fixed to each other during the thinning step and prevents the support from breaking. For example, the retaining means may be a handle substrate or a backing layer.

According to one possible embodiment in which the support comprises a first electronic chip and a second electronic chip, a trench being arranged between the first chip and the second chip, the method may also comprise a step after step b) to separate the first chip and the second chip.

According to one possible embodiment of the method, a step to bend this free conducting end may also be included after the thinning step.

Thus, a connection element can be formed electrically connecting the front face and the back face of the support without needing to make a deposit on the back face of the support.

Once folded, the conducting end can then be connected and assembled to another device, for example another chip.

The conducting end(s) freed in step b) may be made after the separation step.

This bending is advantageously done so as to bring the free end towards the back face of the chip, so that the dimensions of the system composed of the chip and another device once the chip has been assembled connected to this other device can be reduced.

One or both of the conducting ends can be bent by the addition of heat.

Advantageously, a conducting layer can be formed from a stack of at least one first material and at least one second material in contact with the first material and having a coefficient of thermal expansion higher than that of the first material so as to create a bimetallic strip, to facilitate bending by the addition of heat. Since expansion of the second material is more than expansion of the first material due to the addition of heat, the conducting end will bend towards the back face of the chip.

As a variant or in combination with the addition of heat, at least one free conducting end in contact with an inclined lateral flank of a cavity can be bent by applying mechanical pressure.

Advantageously, bending is done by thermo-compression using a gripping device configured to heat the free conducting end(s) while applying them in contact with another device.

According to one embodiment of the method in which the support comprises at least one trench opening at its front face, the trench delimiting a chip located in the support and in which said given wall is a lateral wall of the trench, the method may also comprise the following steps after step b):

separation of the chip by cutting along the trench, assembly of the chip on another support provided with at least one conducting pad, such that said free conducting end is brought into contact with the conducting pad of the other support.

When the angle between the lateral wall and the front face of the support is less than 90°, the final step of assembly with the other support is facilitated in that the free end is already oriented towards the back face of the chip.

BRIEF DESCRIPTION OF THE DRAWINGS

This invention will be better understood after reading the description of example embodiments given purely for information and that are in no way limitative with reference to the appended drawings on which:

FIGS. 3A-3E are top views illustrating a method according to one embodiment of this invention;

FIGS. 5A-5B illustrate a method of bending the free conducting end of conducting elements;

FIGS. 6A-6B illustrate an assembly of the conducting end of conducting elements projecting from the back face of a support with another device, after bending;

Identical, similar or equivalent parts of the different figures have the same numeric references to facilitate comparison between the different figures.

The different parts shown on the figures are not necessarily all at the same scale, to make the figures more easily understandable.

Furthermore, in the following description, terms that are dependent on the orientation such as "lateral", "front", "back", "bottom", etc. of a structure should be understood assuming that the structure is oriented as shown on the figures.

DETAILED PRESENTATION OF PARTICULAR EMBODIMENTS

An example of the method according to one embodiment of this invention for use of a device comprising one or several connection elements projecting from the back face of a support and connected to one or several corresponding conducting pads located on the front face of this support will now be described with reference to FIGS. 2A-2F, 3A-3E, 4A-4H that shown cross-sectional views, top views, and three-quarter views respectively of the device during manufacturing.

Figures 4A, 4B:
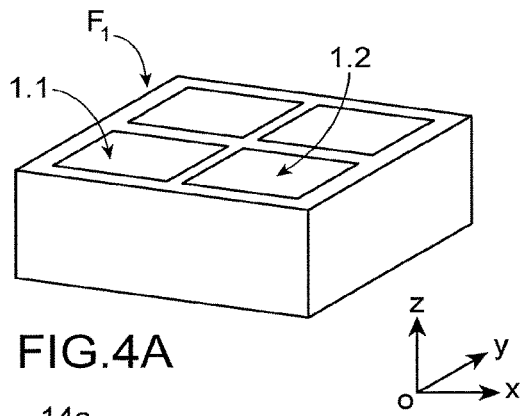
FIGS. 4A-4H are three-quarter views illustrating a method according to one embodiment of this invention.

The description starts with reference to FIGS. 3A and 4A that illustrate a possible initial device for the method in the form of a support 1 composed of a plate 2 or a substrate 2, for example based on a semiconductor material. The support 1 may comprise elements 1.1, 1.2, 1.3 that will be separated from each other, for example such as electronic chips or integrated circuits or electronic components that may or may not be identical to each other.

Figure 1:
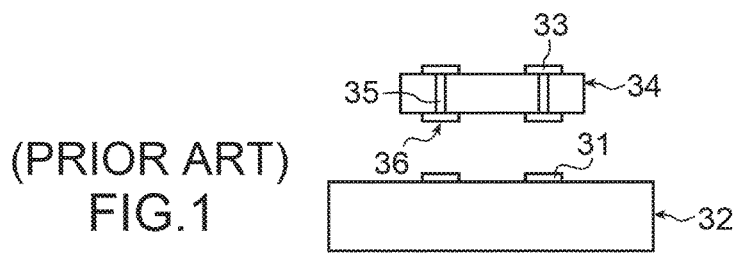
FIG. 1 illustrates an assembly and connection step between a chip and a support based on a technique according to prior art.
Figure 2A:
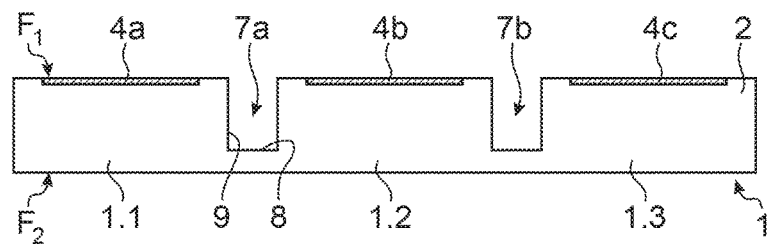
FIGS. 2A-2F are cross-sectional views illustrating a method aimed at forming conducting elements connected to the front face of a support and provided with a free conducting end at the back face of the support.
Figure 2B:
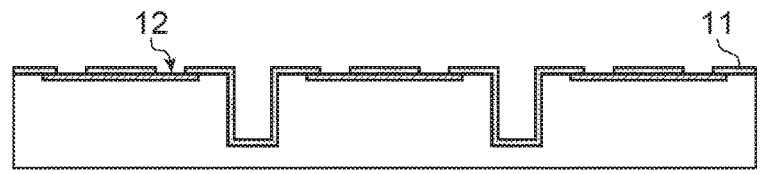

As illustrated on FIG. 2A, the support 1 may also be provided with one or several active parts of chips provided with discontiguous conducting pads 4a, 4b, 4c respectively, on one of the front faces that will be denoted the "front face" F1.

One or several trenches 7a, 7b are firstly made through the front face of the support 1 (FIGS. 2A and 3B). The trenches 7a, 7b delimit the elements 1.1, 1.2, 1.3 of the support that will be separated from each other. In one embodiment illustrated on FIG. 4B, the trenches 7a, 7b may be formed by sawing.

The trenches 7a, 7b are preferably made such that they do not pass through the entire thickness of the support 1. In this description, the "thickness" is a dimension measured between the front face F1 and a face called the "back face" F2 opposite the front face, along a direction parallel to the vector z of an orthogonal coordinate system [O; x; y; z].

The trenches 7a, 7b thus comprise a bottom 8 located in the thickness of the support 1 and lateral walls 9 that extend in a direction making a non-zero angle with the front face and/or the back face of the support. In the particular example in FIG. 2A, the lateral walls 9 of the trenches 7a, 7b extend along a direction orthogonal to the front face F1 and the back face F2 of the support 1. However, the angle between the lateral walls 9 and the front face F1 or the back face F2 may be different from 90°.

The next step is to form an insulating layer 11 on the front face of the support 1. In the particular example illustrated on FIG. 2B, the insulating layer 11 made is distributed so as to cover the bottom 8 and the lateral walls 9 of the trenches 7a, 7b.

Some regions of the conducting pads 4a, 4b, 4c may also be coated. The insulating layer 11 comprises openings exposing other regions of active parts of chips, and particularly the conducting pads 4a, 4b, 4c. For example, such a discontinuous insulating layer 11 could be made using deposition and photolithography steps. For example, the insulating layer 11 may be based on an inorganic dielectric material or a polymer to make it more flexible.

The next step is to form a conducting layer 14 on the front face F1 of the support 1. The conducting layer 14 made can be discontinuous and formed from distinct conducting zones, in other words discontiguous zones with no connection between them.

Figures 4C, 4D:
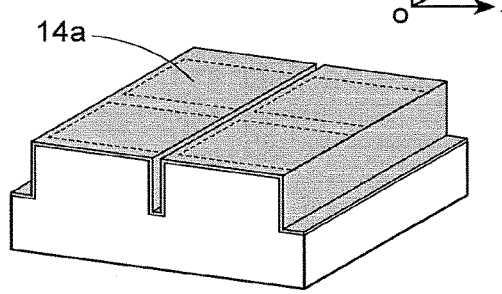

One possible method for making this conducting layer 14 is to make a preliminary deposit of a germination layer 14a for example based on Ti and Cu on the front face F1 of the support 1 (FIGS. 3C and 4C). For example, this deposition can be made by PVD ("Physical Vapour Deposition").

Masking elements 17, for example based on photosensitive resin, are then formed for example by photolithography, on zones of the germination layer 14a located facing the active parts of each of the chips (FIGS. 3D, 4D).

Figure 2C:
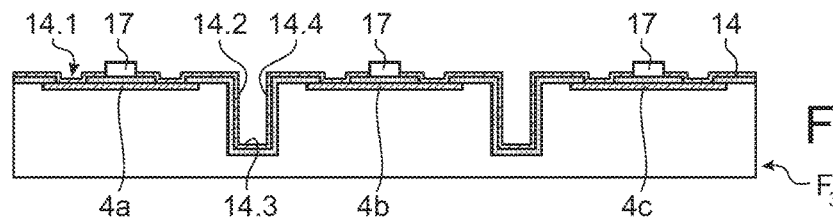

A metallic layer 14b, for example based on copper, is then formed by metallisation of exposed regions of the germination layer 14a that are not protected by masking elements 17 (FIG. 2C).

Figures 4E, 4F:
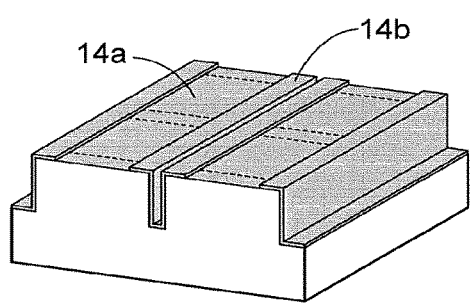

The masking elements 17 are then removed (FIG. 4E), and the areas of the germination layer 14a that are not covered by the metallic layer 14b are then etched (FIG. 4F). Patterns can be made in the conducting layer 14, for example by etching or laser ablation.

The conducting layer 14 thus made comprises a conducting portion 14.1 in contact with a conducting pad 4a located on the front face of the support, the conducting portion 14.1 extending on the front face and being connected to another conducting portion 14.2 that extends on a wall that makes a non-zero angle with the front face.

In the example embodiment in FIG. 2C, the other conducting portion 14.2 extends along a lateral wall 9 of the trench 7a and may be connected to a conducting portion 14.3 coating the bottom 8 of the trench 7a, itself connected to a conducting portion 14.4 located along another lateral wall 9 of the trench 7a.

Thus, in the example given in FIG. 2C, the conducting layer 14 made is distributed so as to cover the bottom 8 and the lateral walls 9 of the trenches 7a, 7b, and said other regions of the active parts of chips and particularly of conducting pads 4a, 4b, 4c exposed through openings 12 provided in the insulating layer 11.

Other arrangements in which the conducting layer 14 partially covers the trenches 7a, 7b and/or covers a lateral wall F3 of the support 1 can also be provided. As a variant, the conducting portion 14.3 at the bottom of the trench is not necessarily made, if a deposition is made under oblique incidence.

The next step is thinning of the support 1 from its back face F2. In the example embodiment illustrated on FIGS. 2D and 4G, this thinning is done so as to reach the bottom 8 of the trenches 7a, 7b.

In this case, a portion 14.3 of the conducting layer 14 located at the bottom of the trenches can be deleted. The conducting portions 14.2 and 14.4 of the conducting layer located on the lateral walls of the trenches are then separated from each other.

Figure 2D:
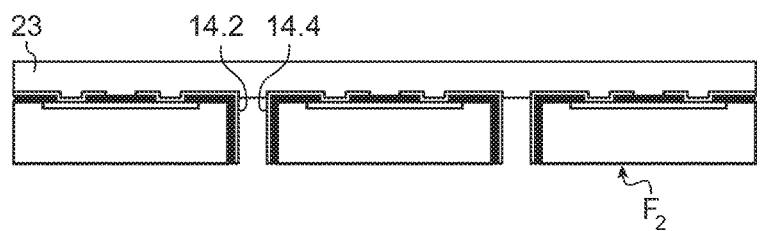

As illustrated in the particular example embodiment in FIG. 2D, a so-called "mechanical backing" layer 23 added on prior to thinning may be applied on the front face F1 of the support 1 in order to keep elements 1.1, 1.2, 1.3 of the support 1 together and/or to prevent breakage of the support 1 during thinning. As a variant, a handle substrate may be provided to make the mechanical backing.

An example method of making this thinning includes a grinding step of the support.

Figure 2E:
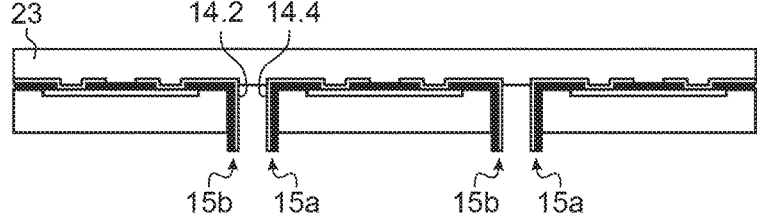

Thinning may then be continued as illustrated on FIG. 2E, so as to release the ends 15a, 15b of conducting portions 14.2, 14.4 formed on the lateral walls of trenches. These free conducting 15a, 15b project from the back face F2 of the support 1 and are not in contact with the support 1. This additional removal of a portion of the support 1 at its back face F2 may for example be made by etching. Fluorinated plasma etching may be possible, for example if the support 1 is based on silicon.

The conducting ends 15a, 15b thus released may then be connected to conducting zones of another support.

After the support 1 has been thinned at its back face and the ends 15a, 15b of the conducting portions have been released, the chips or integrated circuits or components 1.1, 1.2, 1.3 can be released from the support 1.

Separation may include removal of the backing layer 23. This removal may be made particularly by a mechanical action, for example by peeling off this layer 23.

An additional cut of the support 1 may then be made to separate the chips 1.1, 1.2, 1.3 from each other. This cut may be made along cut planes that cross the trenches 7a and 7b and extend orthogonally to the trenches 7a, 7b.

Figure 2F:
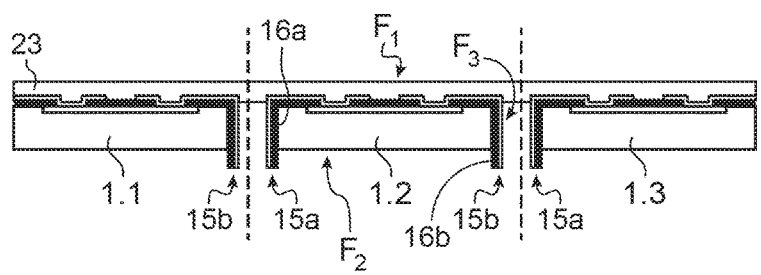

Cut planes on FIGS. 2F and 3E are shown by dashed lines.

Figures 4G, 4H:
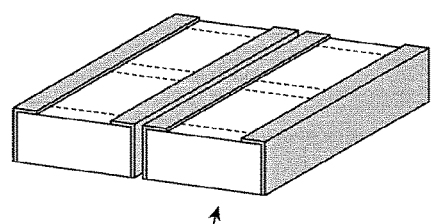

In one example embodiment illustrated on FIG. 4H, this separation is made by sawing.

Finally, the result obtained is chips 1.1, 1.2, 1.3 provided with distinct connection elements 16a, 16b located on the front face F1 of the chips and that extend on each side of the chips along their lateral walls F3 or lateral edges F3. The connection elements 16a, 16b comprise ends 15a, 15b projecting beyond the back face F2 and that can be connected with another device or another support.

An example of a process like that described above is particularly suitable for the production of connection elements on a support 1 or thin chips 1.1, 1.2, 1.3, for example between 50 and 200 µm thick.

A variant of the method that has just been described allows for the use of a reconstituted support as the initial device, as described for example in document WO 2008/155231 and comprising a wafer 80 or a board based on glass or polymer silicon provided with cavities inside which chips 1.1, 1.2, 1.3 or components or integrated circuits are housed and are attached to the wafer by means of an adhesive 84.

In the example embodiment illustrated on FIG. 4H, the connection elements 16a, 16b formed on the chips 1.1, 1.2, 1.3 extend along the entire length L (measured parallel to the coordinate system [O; x; y; z]) of their edges or lateral flanks.

As a variant, connection elements 16a or 16b that extend along only a portion of the lateral edges of a chip 1.2 or 1.3 can be made by forming holes 91 in the lateral walls of the trenches after metallisation of the trenches and before the step to separate chips 1.2, 1.3.

Figure 9:
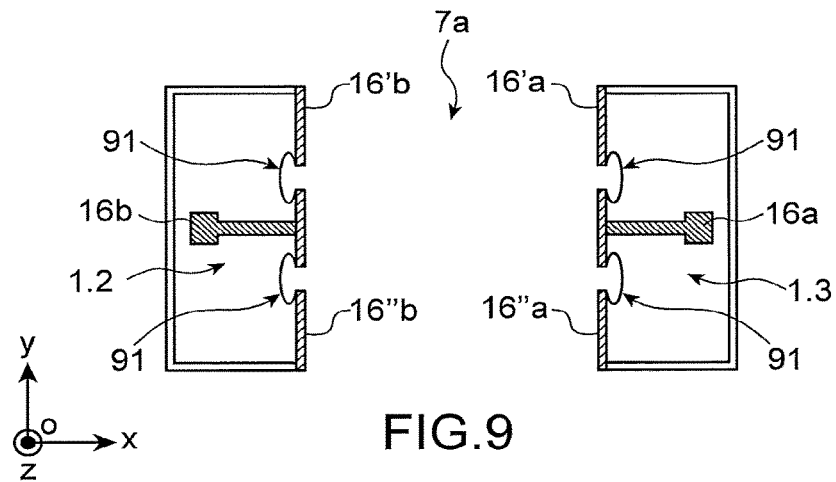
FIG. 9 illustrates a variant embodiment of the method according to the invention in which holes are formed along lateral walls of the trenches in order to separate conducting zones formed on these walls.

Such a variant is illustrated on FIG. 9 that shows a top view of a trench 7b separating the lateral edges of the two chips 1.2 and 1.3. Several discontiguous connection elements 16a, 16'a, 16"a or 16b, 16'b, 16"b that are not connected to each other can thus be made on the lateral edges of each chip.

According to another example embodiment, independent and discontiguous connection elements 16a 16'a, 16"a can be defined running along the same side wall of a trench, for example by laser ablation.

It would also be possible to facilitate assembly and connection of a chip 1.1 with a different backing once the support has been cut, by bending the free conducting ends 15a, 15b of the connection elements.

A method of bending the free conducting ends 15a, 15b projecting from the back face of a chip 1.2 or an integrated circuit 1.2 once the support 1 has been cut out is illustrated on FIGS. 5A-5B.

In this example, this bend is made so as to bring the conducting ends 15a, 15b of the connection elements 16a, 16b towards the back face F2 of the chip 1.2. This is done by bringing these free conducting ends 15a, 15b into contact under pressure with the inclined lateral flanks 53 of a cavity 51 formed in a support 50. This support 50 then acts as a press, against which the chip 1.2 is pressed.

The chip 1.2 may be gripped and forced into contact with the support 50 by means of a robot-controlled unit of the type commonly called "pick and place".

Once the curved conducting ends 15a, 15b are under the chip 1.2, this chip 1.2 can be assembled with another device such as a "Printed circuit board" (PCB) or a PCB inserter or another identical or different chip.

FIGS. 6A-6B illustrate an example of such an assembly type in which the free conducting ends 15a, 15b partially curved towards the back face F2 of the chip are then pressed in contact with the conducting ends 65a, 65b of an interconnection substrate 60. The result is that the connecting elements 16a, 16b of the chip 1.2 are brought into electrical contract with the conducting areas 65a, 65b of the substrate 60, and the conducting ends 15a, 15b are brought into mechanical contact with the back face of the chip 1.2.

The result obtained is thus a compact assembly and a connection between the substrate 60 and the chip 1.2.

As a variant or in combination with a mechanical action, the conducting ends 15a, 15b may be bent by the addition of heat.

In this case, the conducting ends 15a, 15b can advantageously be formed from a stack of conducting materials in contact with each other and with different coefficients of thermal expansion.

A Ti and Cu stack can for example be made to form a conducting layer 14 based on which the conducting ends 15a, 15b are formed, given that the ratio between the coefficients of thermal expansion of these materials is of the order of 2.

In using a conducting layer 14 composed of a bilayer with the properties of a bimetallic strip, a partial curvature effect can be obtained at the free conducting ends 15a, 15b when sufficient heat is added. For example for a Ti/Cu bimetallic strip, the temperature is preferably set to more than 100° C., for example equal to 200° C. or more.

It would also be possible to adapt the method of making the conducting layer 14 to facilitate bending of the conducting ends 15a, 15b, particularly when the conducting layer 14 is formed from a stack of different materials.

The different methods mentioned above to facilitate bending can be combined.

Figure 7A:
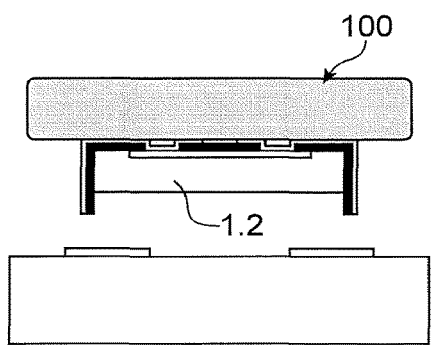
FIGS. 7A-7D illustrate a variant embodiment in which a chip or support gripping device is configured to heat conducting elements on this chip or this support so as to curve them and then pressurise them in contact with another device.
Figure 7B:
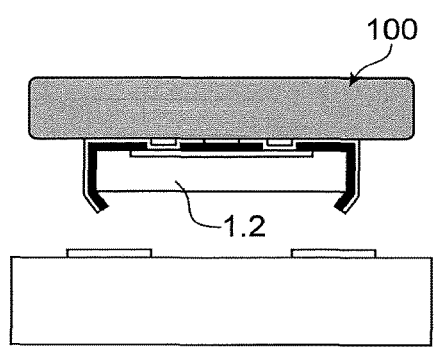
Figure 7C:
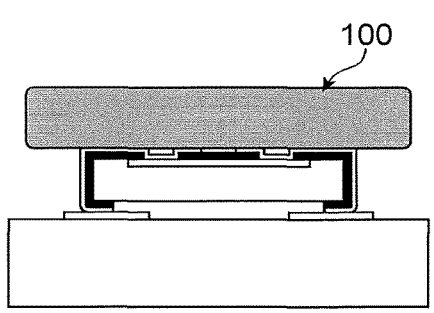

FIGS. 7A-7D illustrate an example of an assembly between the chip 1.2 and a support 60 making use of a device 100 configured to take the chip 1.2 (FIG. 7A), and then heat the chip 1.2 so as to cause a curvature between the conducting ends 15a, 15b (FIG. 7B), apply pressure between the chip 1.2 and the conducting areas 65a, 65b of the substrate 60 while continuing to input heat (FIG. 7C).

Figure 7D:
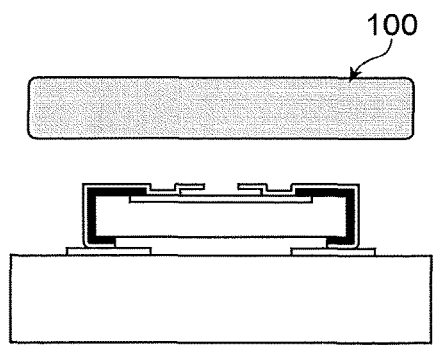
Figure 8:
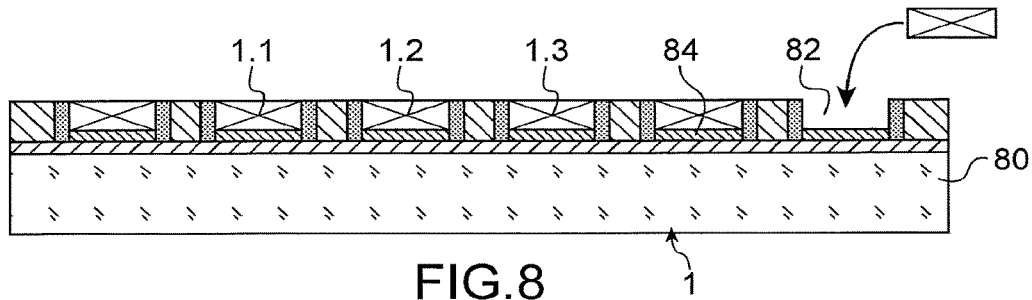
FIG. 8 illustrates a variant embodiment of the method according to the invention for which the initial device is a reconstituted support.

Soldering is possible depending on the nature of the materials to be assembled. Once the assembly and the connection between the chip 1.2 and the substrate 60 have been made, the device 100 releases the chip (FIG. 7D).

For example, the device 100 used may be a "pick and place" type robot fitted with heating gripping means.

Figures 10A, 10B:
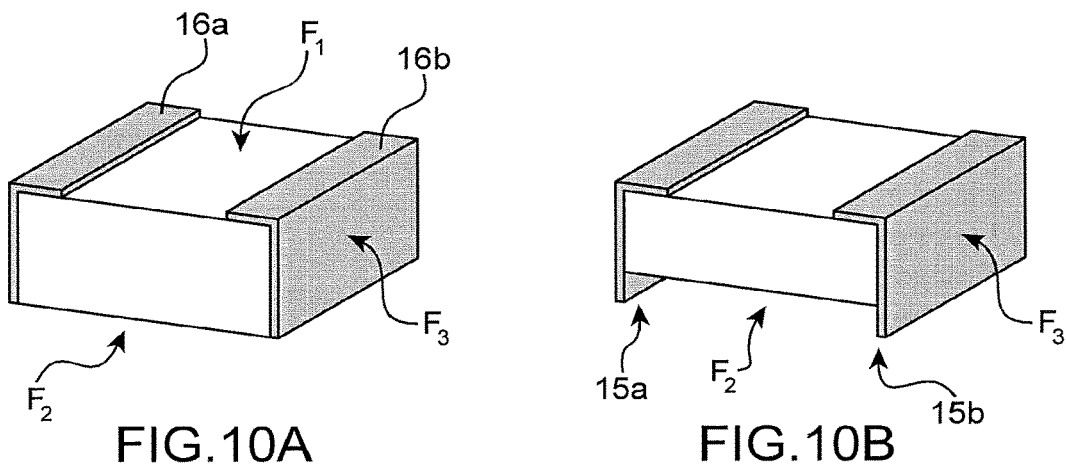
FIGS. 10A-10B illustrate a variant embodiment of the method according to the invention in which connection elements passing through the lateral edges of a chip are formed directly on the chip before it is thinned.

FIGS. 10A, 10B illustrate another variant embodiment in which the connection elements 16a, 16b are formed on a previously cut individual chip 1.2. The connection elements 16a, 16b located on the front face of the chip extend on each side of the chip along the lateral edges or lateral walls F3 of the chip (FIG. 10A). The next step is to thin the chip 1.2 at its back face F2, so as to release the ends of the connection elements 16a, 16b from the chip 1.2 (FIG. 10B).

Figure 11:
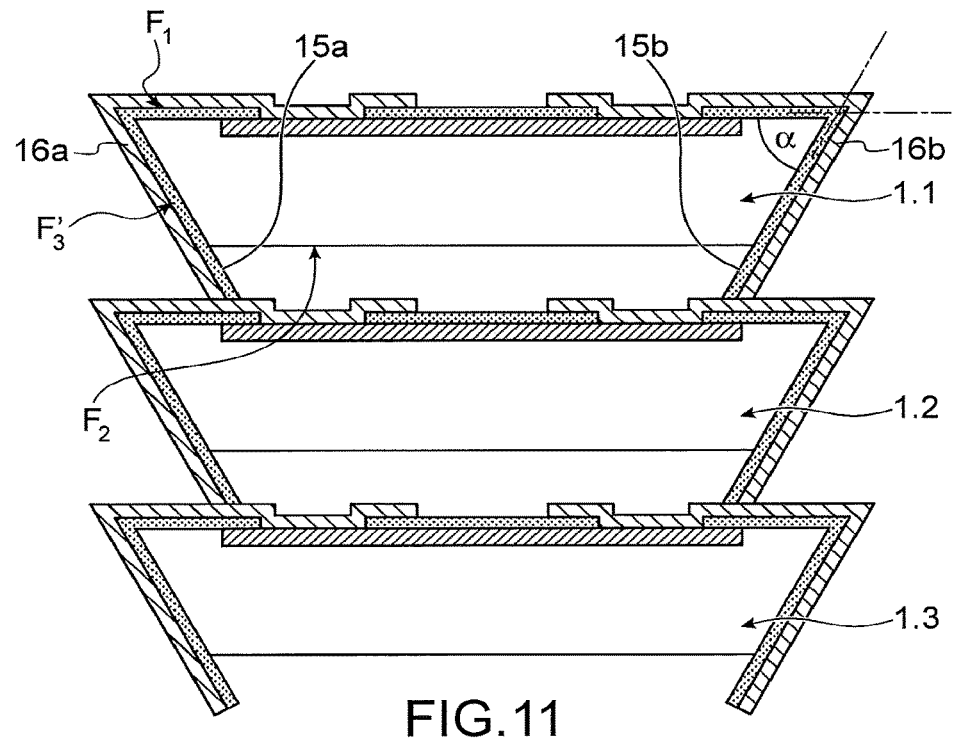
FIGS. 11 and 12 illustrate assemblies of chips with lateral edges making an acute angle with their front face, the connection between a first chip and a second chip being made by means of connection elements running along the lateral edges of the first chip.

On FIG. 11, a superposition of chips 1.1, 1.2, 1.3 has been made in which each chip 1.1, 1.2, 1.3 is provided with connection elements 16a, 16b on its front face and that extend on each side of the chip along the lateral edges or lateral walls F'$_3$ of the chip. In this particular embodiment, the lateral edges or lateral walls F'$_3$ of the chips 1.1, 1.2, 1.3 make an angle α less than 90°, for example between 75° and 85° with their front face F$_1$.

The cross-section of the chips 1.1, 1.2, 1.3 may be approximately in the shape of a trapezium in which the largest base is the front face F$_1$ of the chip and the smallest base is the back face F$_2$ of the chip.

The fact that there is an acute angle α between a lateral edge F$_3$ of a chip 1.1 and its front face F$_1$ can facilitate the connection between a connection element 16a, 16b that extends on its front face F$_1$ and on a lateral edge F$_3$ and a conducting zone of another device that is placed facing the back edge of the face F$_2$ of the chip 1.1.

In the particular embodiment shown in FIG. 11, the free ends 15a, 15b of the connection elements 16a, 16b of a chip 1.1 are thus connected to other connection elements 16a, 16b of another chip 1.2 on the front face of this other chip 1.2. In this case the free ends 15a, 15b of the connection elements 16a, 16b of a chip 1.1 are connected without necessarily being bent towards the back face $F_2$ of this chip 1.1.

Figure 12:
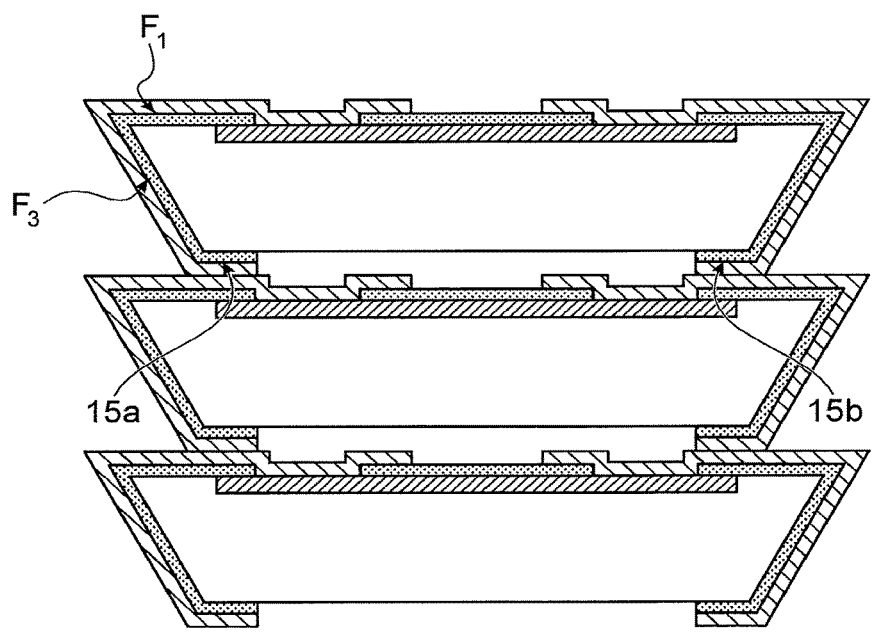

FIG. 12 illustrates a more compact assembly, in this case with the ends 15a, 15b of the connection elements 16a, 16b of a chip 1.1 that are folded and that extend along a portion of the back face $F_2$ of this chip 1.1.

An example method of making the chips 1.1, 1.2, 1.3 with inclined lateral edges as illustrated on FIG. 11 or 12 will now be described with reference to FIGS. 13A-13E.

The method can be started using the same starting device as in the example method described above with reference to FIGS. 2A-2F.

One or several trenches 77a, 77b are firstly made through the front face F1 of the support 1 (FIG. 2A). In this example, the trenches 77a, 77b comprise a bottom 8 located in the thickness of the support 1 and lateral walls 9 that extend in a direction making an angle α less than 90° with the front face $F_1$ of the support. Thus, the bottom 8 of the trenches 77a, 77b is wider than their opening. The trenches 77a, 77b delimit separation zones between chips 1.1, 1.2, 1.3.

When the support 1 is semiconducting and for example based on silicon, the trenches 77a, 77b can be made for example using a method of the type described in document U.S. Pat. No. 5,501,893 or in the "High aspect ratio Bosch etching of sub 0.25 μm trenches for hyperintegration" document by Wang et al., Journal of Vacuum Science and Technology B 25, 1376 (2007).

Figure 13A:
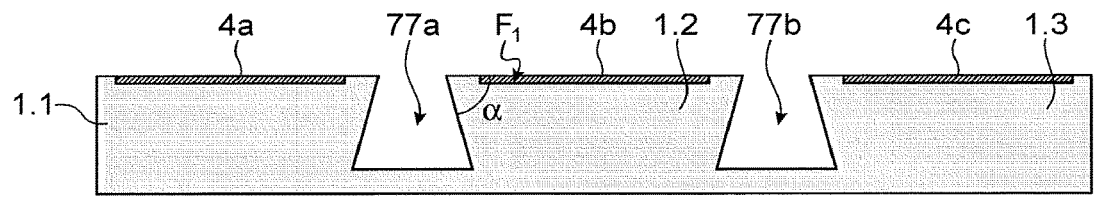
FIGS. 13A-13E illustrate a method making a chip with lateral edges making an acute angle with its front face and provided with conducting elements extending on its lateral edges.
Figure 13B:
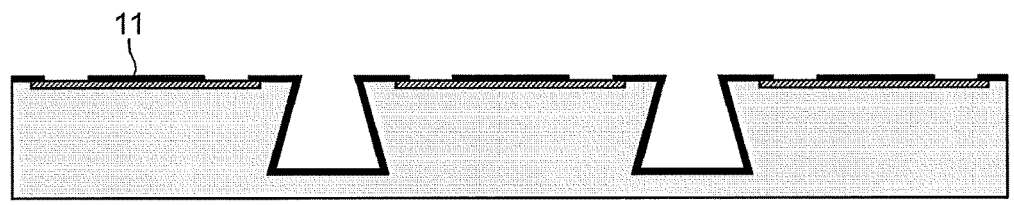

The next step is to form the insulating layer 11 on some areas of the front face of the support 1. The insulating layer 11 in this example covers the bottom 8 and the lateral walls 79 of the trenches 77a, 77b (FIG. 13B).

Figure 13C:
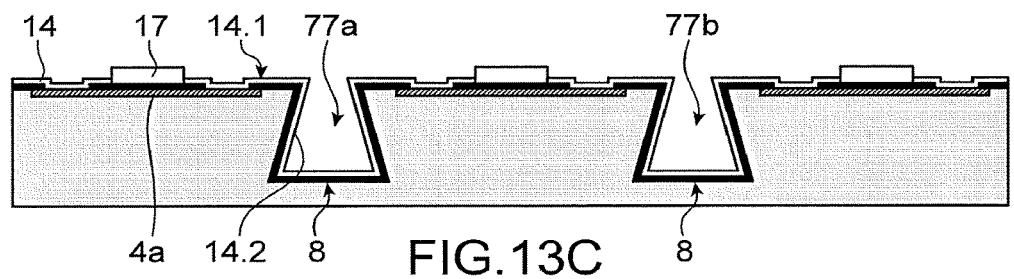
Figure 13D:
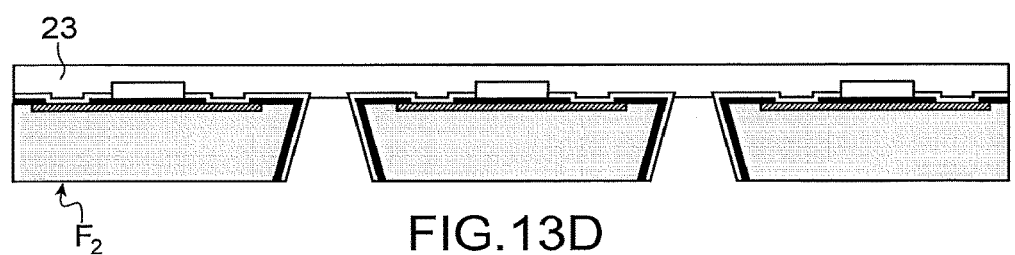

The next step is to form a conducting layer 14 on some regions of the front face $F_1$ of the support 1 that are not covered by masking elements 17 formed beforehand for example by photolithography. The conducting layer 14 in this example coats the bottom 8 and the lateral walls 79 of the trenches 77a, 77b (FIG. 13C).

The conducting layer 14 thus made comprises a conducting portion 14.1 in contact with a conducting pad 4a located on the front face of the support, the conducting portion 14.1 extending on the front face and being connected to another conducting portion 14.2 that extends on a wall that makes an acute angle α with the front face.

The next step is thinning of the support 1 at its back face F2. In the example embodiment illustrated on FIGS. 13C and 13D, this thinning is done so as to reach and eliminate the bottom 8 of the trenches 77a, 77b.

A mechanical backing means, for example in the form of a handle substrate or a deposited layer 23 can be formed on the front face F1 of the support 1 before thinning so that this step can be done without damaging the support 1.

Figure 13E:
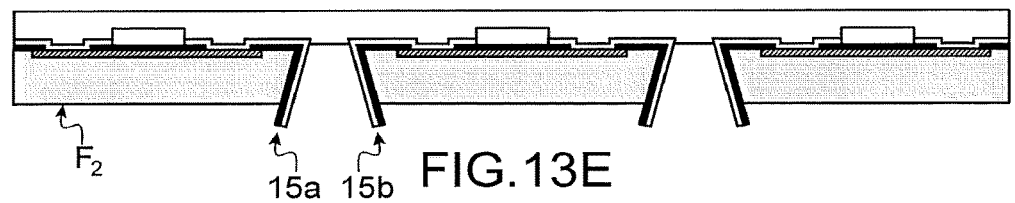

The thinning step may then be prolonged or may also include etching, as illustrated on FIG. 13E, so as to release the ends 15a, 15b of conducting portions formed on the lateral walls of trenches 77a, 77b. These free conducting ends 15a, 15b project from the back face F2 of the support 1 and are not in contact with the support 1. The conducting ends 15a, 15b thus released may then be connected to conducting zones of another support, for example a substrate or another chip.

The support may be cut before assembly with another support, so as to dissociate the chips 1.1, 1.2, 1.3. This cut is advantageously made along trenches 77a, a lateral wall of a trench then forming a lateral edge of a chip.

The invention claimed is:

1. A method of making one or several connection elements for a microelectronic device, comprising:
   forming a conducting layer on a support on which there are one or several conducting pads located on a front face of the support opposite a back face thereof, the conducting layer comprising a first conducting portion in contact with at least one conducting pad located on the front face, the first conducting portion extending on the front face and being connected to at least one second conducting portion extending in contact with at least one given wall of the support, the at least one given wall being located between the front face and the back face and forming a non-zero angle with the front face of the support;
   thinning the support at the back face to release one conducting end of the second conducting portion as a free conducting end projecting from the back face of the support; and
   after the thinning of the support, bending the free conducting end projecting from the back face of the support.

2. The method according to claim 1, wherein the support comprises at least one trench opening up at a front face thereof, the at least one given wall being a lateral wall of the at least one trench.

3. The method according to claim 2, wherein the at least one trench comprises a bottom located between the front face and the back face of the support, the thinning being performed to reach the bottom of the trench.

4. The method according to claim 1, wherein the support comprises at least one trench opening up on a front face thereof, the at least one given wall being a lateral wall of the at least one trench, the conducting layer being deposited in a bottom and on lateral walls of the at least one trench.

5. The method according to claim 1, wherein the at least one given wall is coated with an insulating layer before formation of the conducting layer.

6. The method according to claim 1, wherein the support comprises at least one trench opening up on a front face thereof, the at least one given wall being a lateral wall of the at least one trench, the lateral wall forming an angle of less than 90° with the front face.

7. The method according to claim 1, further comprising, between the forming of the conducting layer and the thinning of the support, transferring a backing substrate or a backing layer on the front face of the support.

8. The method according to claim 1, wherein the support comprises at least one trench opening up on a front face thereof, a first electronic chip, and a second electronic chip, the at least one trench being located between the first electronic chip and the second electronic chip, the method further comprising, after the thinning of the support, separating the first electronic chip and the second electronic chip.

9. The method according to claim 1, wherein the support comprises at least one trench opening up on a front face thereof, the method further comprising, between the forming of the conducting layer and the thinning of the support, forming conducting patterns in the conducting layer.

10. The method according to claim 9, wherein the at least one given wall is a lateral wall of the at least one trench, the method further comprising locally removing the conducting layer to define discontiguous conducting elements along the lateral wall of the at least one trench.

11. The method according to claim 1, wherein the free conducting end is bent to bring the free conducting end towards the back face.

12. The method according to claim 1, wherein the bending is performed at least partly by addition of heat.

13. The method according to claim 12, wherein the conducting layer is formed from a stack of at least one first material and at least one second material in contact with the at least one first material and having a coefficient of thermal expansion that is greater than that of the at least one first material.

14. The method according to claim 1, wherein the bending:
   includes mechanical pressurisation of the free conducting end against an inclined lateral flank of a cavity against which the support bears, and/or
   is performed using a gripping device configured to heat the support while applying the heat in contact with another support.

15. The method according to claim 1, wherein the support comprises at least one trench opening up on a front face thereof, the at least one trench delimiting a chip located in the support, the at least one given wall being a lateral wall of the at least one trench, the method further comprising, after the thinning:
   separating the chip by cutting along the at least one trench, and
   assembling the chip on a structure provided with at least one conducting pad, such that the free conducting end projecting from the back face of the support is brought into contact with the at least one conducting pad.

* * * * *